(12) United States Patent
Takahashi

(10) Patent No.: US 7,984,536 B2
(45) Date of Patent: Jul. 26, 2011

(54) METHOD OF MANUFACTURING A PIEZOELECTRIC RESONATOR

(75) Inventor: Takehiro Takahashi, Sayama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 0 days.

(21) Appl. No.: 12/590,108

(22) Filed: Nov. 3, 2009

(65) Prior Publication Data

US 2010/0117490 A1    May 13, 2010

(30) Foreign Application Priority Data

Nov. 11, 2008    (JP) .................. 2008-289098

(51) Int. Cl.
*H04R 17/10* (2006.01)
*B23K 26/36* (2006.01)

(52) U.S. Cl. ....... 29/25.35; 310/312; 310/344; 310/370; 219/121.68; 219/121.69

(58) Field of Classification Search ................. 29/25.35; 310/312, 341, 344, 370; 219/121.68, 121.69
See application file for complete search history.

(56) References Cited

U.S. PATENT DOCUMENTS

| | | | |
|---|---|---|---|
| 4,021,898 A * | 5/1977 | Willis et al. .................. | 29/25.35 |
| 7,279,824 B2 * | 10/2007 | Tanaya et al. ................. | 310/344 |
| 2003/0168943 A1 | 9/2003 | Matsuyama et al. | |

FOREIGN PATENT DOCUMENTS

| | | |
|---|---|---|
| JP | 3-243010 | 10/1991 |
| JP | 51-91685 | 7/1993 |
| JP | 2000-223998 | 8/2000 |
| JP | 2002-232252 | 8/2002 |
| JP | 2003-060470 | 2/2003 |
| JP | 2003-133879 | 5/2003 |
| JP | 2003-133883 | 5/2003 |
| JP | 2004297348 A * | 10/2004 |
| JP | 2007-073652 | 3/2007 |
| JP | 2008-054018 | 3/2008 |
| JP | 2008-072618 | 3/2008 |

* cited by examiner

*Primary Examiner* — A. Dexter Tugbang
(74) *Attorney, Agent, or Firm* — Jordan and Hamburg LLP

(57) ABSTRACT

To provide a piezoelectric resonator in which a casing houses a tuning-fork piezoelectric resonator element and whose failure occurrence caused when shavings of adjustment films scatter and adhere to excitation electrodes is prevented. In a method of manufacturing a quartz-crystal resonator in which a casing 20 houses a quartz-crystal resonator element 10 including a tuning-fork quartz-crystal piece 11, excitation electrodes 6a, 6b, 6c, and adjustment films 8 for frequency adjustment, a wall surface 29 preventing shavings of the adjustment films 8 from scattering is formed between an atmosphere where the excitation electrodes 6a, 6b, 6c are located and an atmosphere where the adjustment films 8 are located inside the casing 20, and when the adjustment films 8 are shaved by a laser beam in order to adjust the frequency of the quartz-crystal resonator element 10, the wall surface 29 prevents the scattering shavings from adhering to the excitation electrodes 6a, 6b, 6c and causing a short circuit thereof, thereby reducing the occurrence of a failure.

5 Claims, 9 Drawing Sheets

(a)

(b)

ARROW A-A (a)

(b)

(c)

(a)

ARROW B-B (b)

ARROW C-C (c)

ARROW D-D (a)

(b)

(c)

(a)

(b)

(c)

ARROW E-E (a)

PRIOR ART

METHOD OF MANUFACTURING A PIEZOELECTRIC RESONATOR

BACKGROUND OF THE INVENTION

1. Field of the Invention

The present invention relates to a piezoelectric resonator in which a tuning-fork piezoelectric resonator element made of, for example, quartz crystal or the like is housed in a casing, and to a manufacturing technique thereof.

2. Description of the Related Art

Conventional piezoelectric resonators include a tuning-fork quartz-crystal resonator adopted as a signal source or the like which keeps pace of a watch. Being small in size, low in cost, and low in power consumption, the tuning-fork quartz-crystal resonator is very effective as a piezoelectric resonator mounted in a small electronic device such as a watch and is coming into use in wider applications. FIG. 9(a) to FIG. 9(c) show an example of this conventional tuning-fork quartz-crystal resonator. The tuning-fork quartz-crystal resonator is structured such that a tuning-fork quartz-crystal resonator element 100 shown in FIG. 9(a) is mounted in a casing 120 shown in FIG. 9(b) via a conductive adhesive 122.

The quartz-crystal resonator element 100 has a base portion 101 and two (pair of) oscillating arms 102 which are set parallel with each other at a predetermined interval and extend in one direction from the base portion 101. In the drawings, 105a and 105b denote groove portions formed in one surface and a rear surface of each of the oscillating arms 102 to enhance oscillation efficiency and reduce a power loss, 106 denotes excitation electrodes exciting tuning-fork oscillation based on bending oscillation in the groove portions 105a, 105b and peripheral areas thereof, 107 denotes lead electrodes, and 120a denotes a cover mounted on the casing 120 to seal it.

In such a quartz-crystal resonator, adjustment films 108 are formed for frequency adjustment on tips of the oscillating arms 102. The adjustment films 108 are formed so as to be apart from the excitation electrodes 106, and as shown in FIG. 9(c), are shaved for the adjustment of thickness and area thereof by, for example, laser irradiation by a laser irradiator 30. However, when the adjustment films 108 are shaved, shavings of the adjustment films 108 scatter and adhere to the excitation electrodes 106 to cause a short-circuit of the excitation electrodes 106, which involves a risk that the quartz-crystal resonator may become a defective product.

To solve this problem, there has been conventionally proposed the following methods. For example, patent document 1 describes a quartz-crystal resonator element in which an excitation electrode and an adjustment film are provided on a tuning-fork quartz-crystal piece and a high-melting point scattering prevention film is formed so as to cover the excitation electrode and the adjustment film. In this quartz-crystal resonator, the adjustment film is melted by laser to be shaved, and the scattering prevention film prevents the adjustment film from scattering at the time of the frequency adjustment. Further, the adjustment films, even if scattering toward the excitation electrode side, adheres onto the scattering prevention film, which can prevent the short-circuit of the excitation electrode. Then, shavings of the cut adjustment film are discharged from a hole that the laser forms in the scattering prevention film. However, forming the scattering prevention film in the quartz-crystal resonator element increases the number of element manufacturing processes and makes the element one size larger, leading to a size increase of the quartz-crystal resonator itself.

Further, patent document 2 describes a quartz-crystal resonator in which, in order to prevent a quartz-crystal resonator element from chipping due to the collision of its oscillating ends with a wall portion of a casing, projecting portions are provided on an upper surface and a lower surface of the casing so that an upper surface and a lower surface of the quartz-crystal resonator element except its tip portion come into contact with the projecting portions. The quartz-crystal resonator of the patent document 2 can prevent chipping of a quartz-crystal piece which becomes the element, but gives no description regarding the prevention of the adhesion of shavings of adjustment films. Therefore, the quartz-crystal resonator of the patent document 2 also involves a risk of becoming a defective product due to the aforesaid problem.

[Patent Document 1] Japanese Patent Application Laid-open No. 2000-223998 (paragraph No. 0019, 0020)

[Patent Document 2] Japanese Patent Application Laid-open No. 2003-133883 (paragraph No. 0011)

SUMMARY OF THE INVENTION

The present invention was made under such circumstances and has an object to provide a piezoelectric resonator in which a tuning-fork piezoelectric resonator element is provided in a casing, and whose failure caused when shavings of adjustment films scatter and adhere to excitation electrodes can be prevented, and to provide an electronic component including the piezoelectric resonator and a method of manufacturing the piezoelectric resonator.

The present invention is a method of manufacturing a piezoelectric resonator in which a casing houses a piezoelectric resonator element, the method including:

manufacturing the piezoelectric resonator element including: a tuning-fork piezoelectric oscillating piece from whose base portion two oscillating arms extend in parallel with each other; excitation electrodes formed on the oscillating arms; adjustment films for frequency adjustment formed on tip sides of the oscillating arms so as to be apart from the excitation electrodes; and a lead electrode formed on the base portion;

forming the casing including a wall surface which is provided between an atmosphere where the excitation electrodes are located and an atmosphere where the adjustment films are located and prevents shavings from scattering to the atmosphere where the excitation electrodes are located when the adjustment films are shaved;

mounting the piezoelectric resonator element in the casing; and shaving the adjustment films by a laser beam to adjust a frequency of the piezoelectric resonator element in the casing.

The wall surface is, for example, a surface on an adjustment film side of a wall portion projecting from an inner wall surface of the casing. Further, in the method of manufacturing the piezoelectric resonator of the present invention, for example, a portion, of the casing, facing at least one of one surface side and another surface side of an adjustment film formation area of the piezoelectric oscillating piece is made of a light transmitting material and the casing has a discharge port for discharging the shavings on a side facing the atmosphere where the adjustment films are located The present invention is a piezoelectric resonator including:

a casing;

a piezoelectric resonator element housed in the casing and including: a tuning-fork piezoelectric oscillating piece from whose base portion two oscillating arms extend in parallel with each other; excitation electrodes formed on the oscillating arms; adjustment films for frequency adjustment formed on tip sides of the oscillating arms so as to be apart from the excitation electrodes; and a lead electrode formed on the base portion; and a wall surface provided in the casing, located between an atmosphere where the excitation electrodes are located and an atmosphere where the adjustment films are located, and preventing shavings from scattering to the atmosphere where the excitation electrodes are located when the adjustment films are shaved.

Further, in the piezoelectric resonator of the present invention, the wall surface may be, for example, a surface on an adjustment film side of a wall portion projecting from an inner wall surface of the casing. Further, in the piezoelectric resonator of the present invention, a portion, of the casing, facing at least one of one surface side and another surface side of an adjustment film formation area of the piezoelectric oscillating piece may be made of a light transmitting material and the casing may have a discharge port for discharging the shavings on a side facing the atmosphere where the adjustment films are located An electronic component of the present invention includes: any of the above-described piezoelectric resonators; a substrate on which the piezoelectric resonator is mounted; and an oscillator circuit oscillating the piezoelectric resonator.

According to the present invention, inside the casing of the piezoelectric resonator, the wall portion is interposed between the atmosphere where the excitation electrodes are located and the atmosphere where the adjustment films are located, and therefore, when the adjustment films are shaved for frequency adjustment, the wall portion blocks off the scattering shavings to reduce the adhesion of the shavings to the excitation electrodes. This prevents the occurrence of a failure of the piezoelectric resonator due to a short-circuit or the like of the excitation electrodes.

DETAILED DESCRIPTION OF THE PREFERRED EMBODIMENTS

Figure 1:
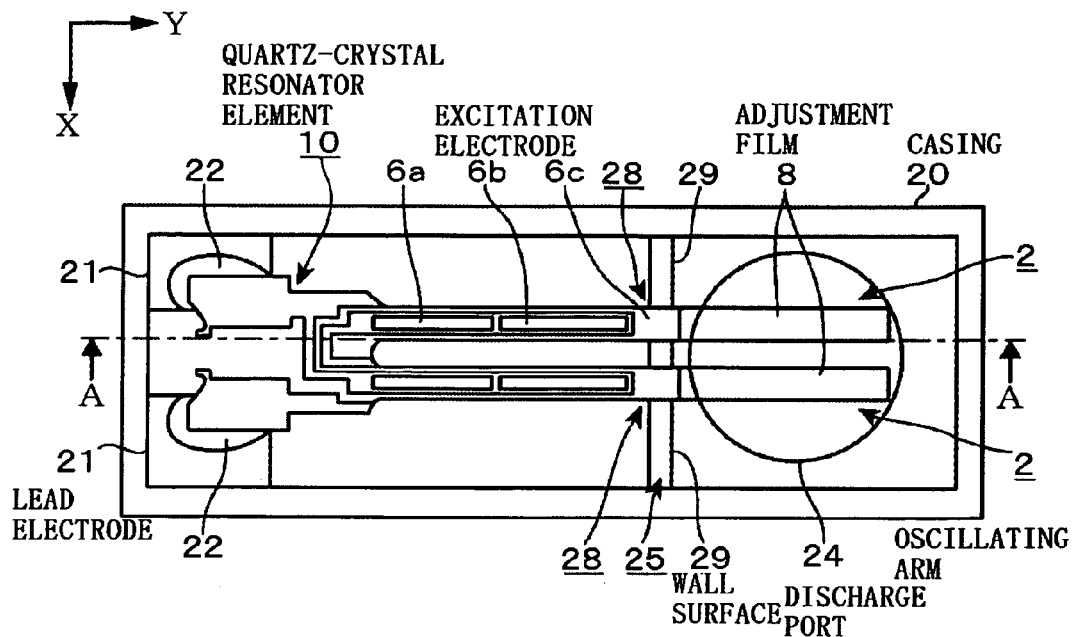
FIG. 1(a) and FIG. 1(b) are explanatory views illustrating the structure of a quartz-crystal resonator of an embodiment.
Figure 1:
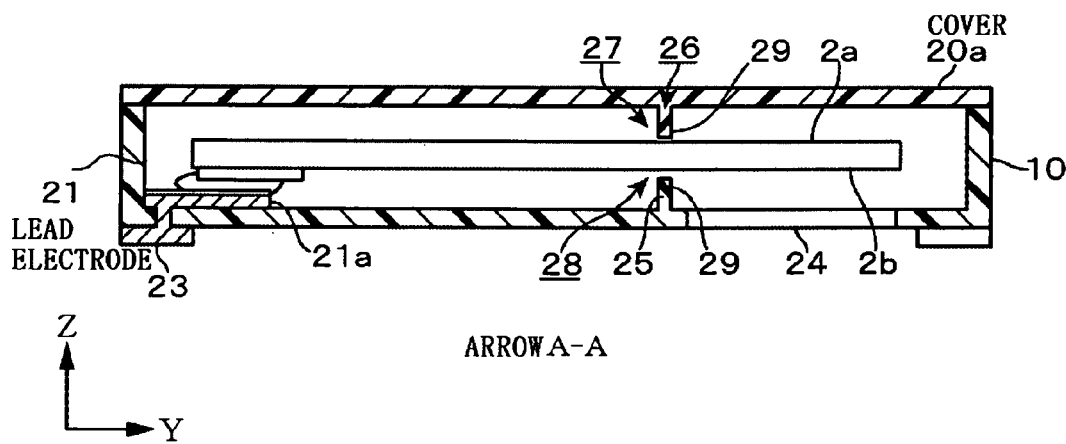
Figure 2:
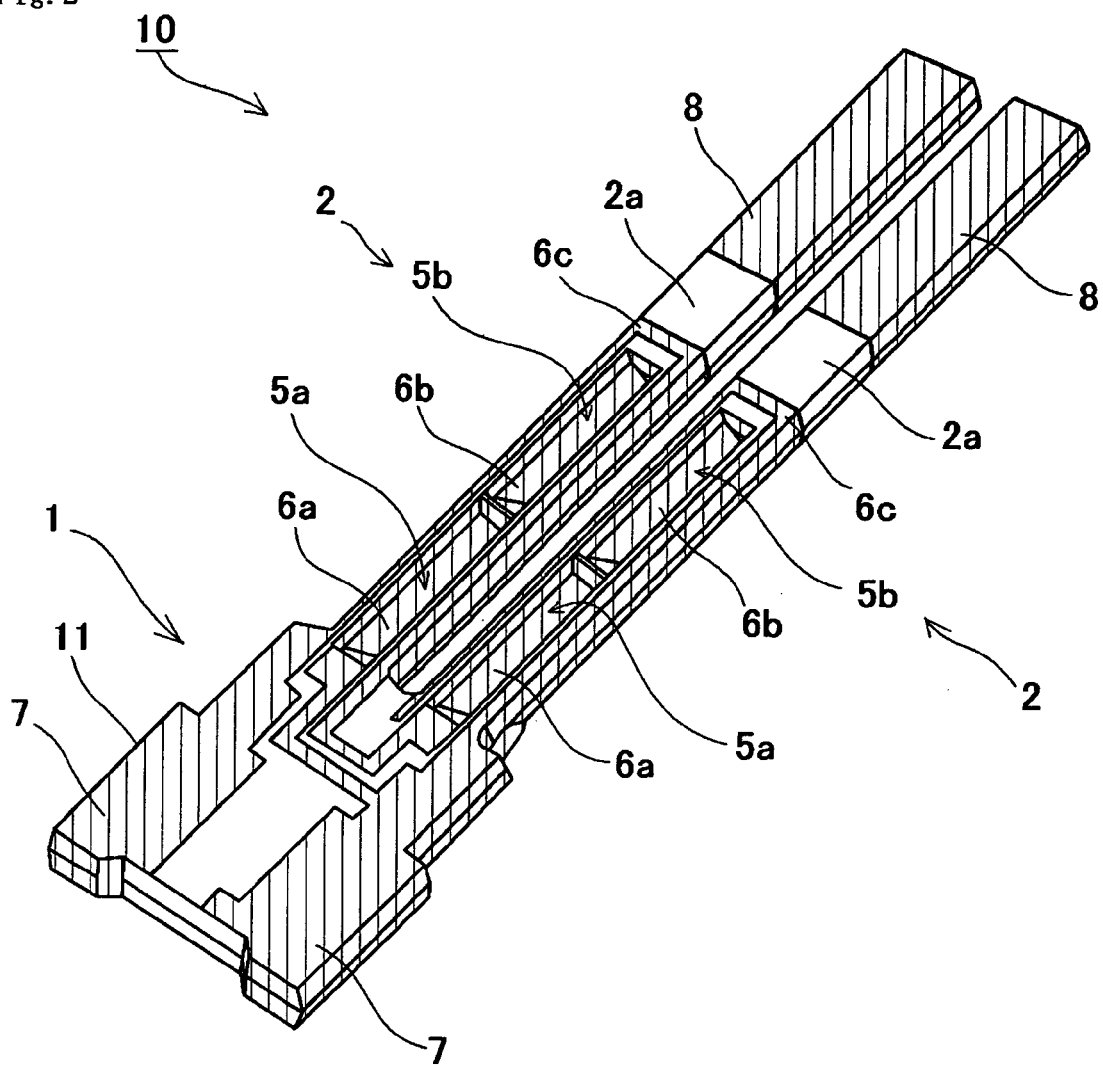
FIG. 2 is a perspective view of a quartz-crystal resonator element of this embodiment.
Figure 3:
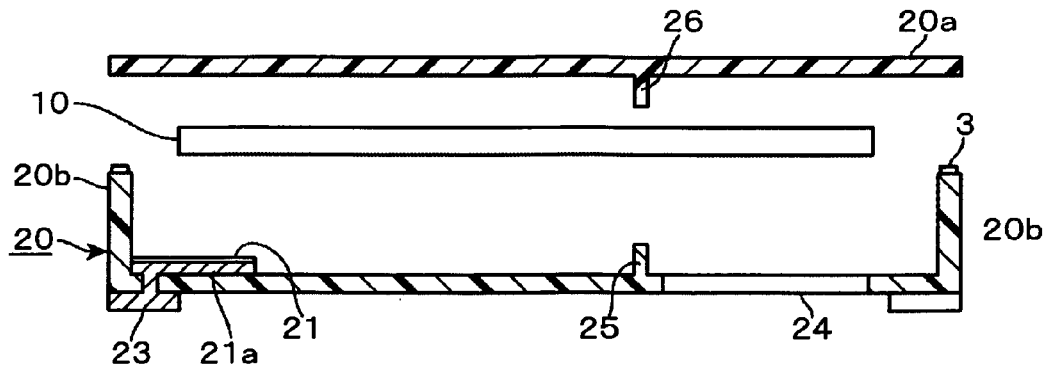
FIG. 3(a) to FIG. 3(c) are first explanatory views illustrating manufacturing processes of the quartz-crystal resonator of this embodiment.
Figure 3:
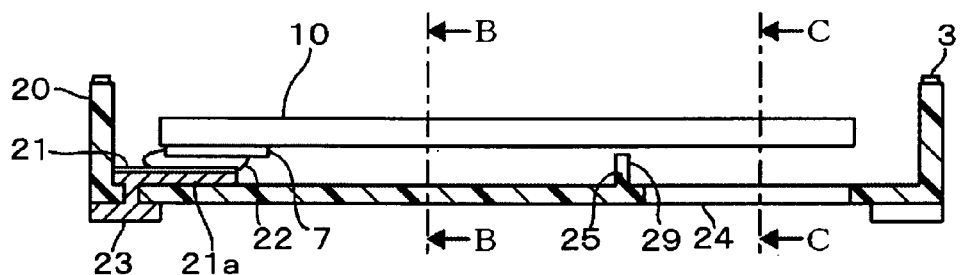
Figure 3:
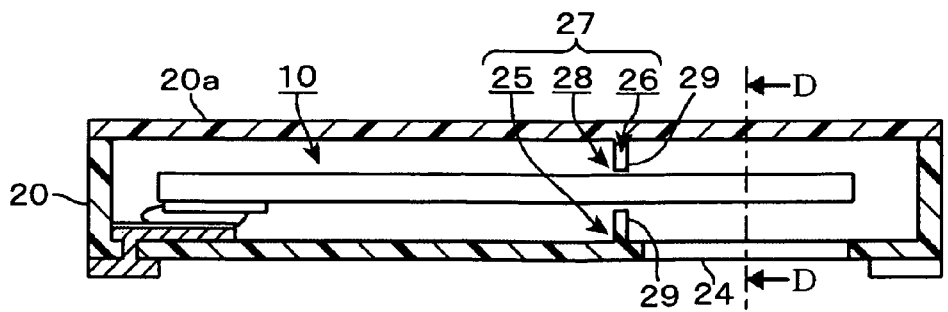
Figure 4:
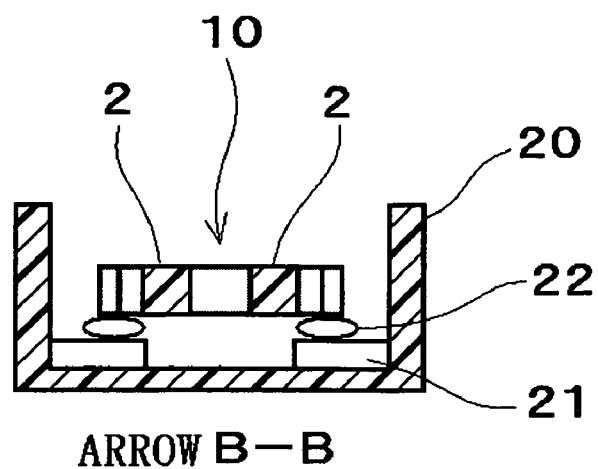
FIG. 4(a) to FIG. 4(c) are second explanatory views illustrating the manufacturing processes of the quartz-crystal resonator of this embodiment.
Figure 4:
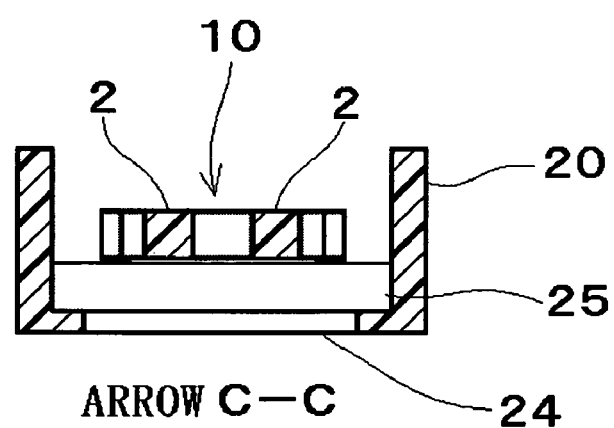
Figure 4:
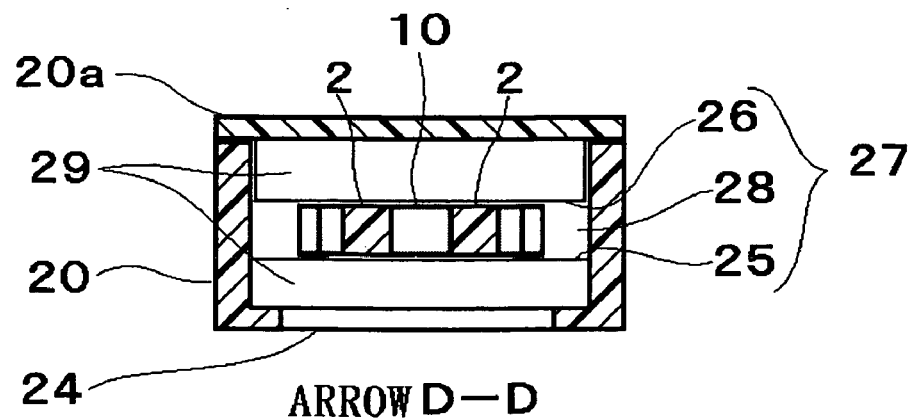
Figure 5:
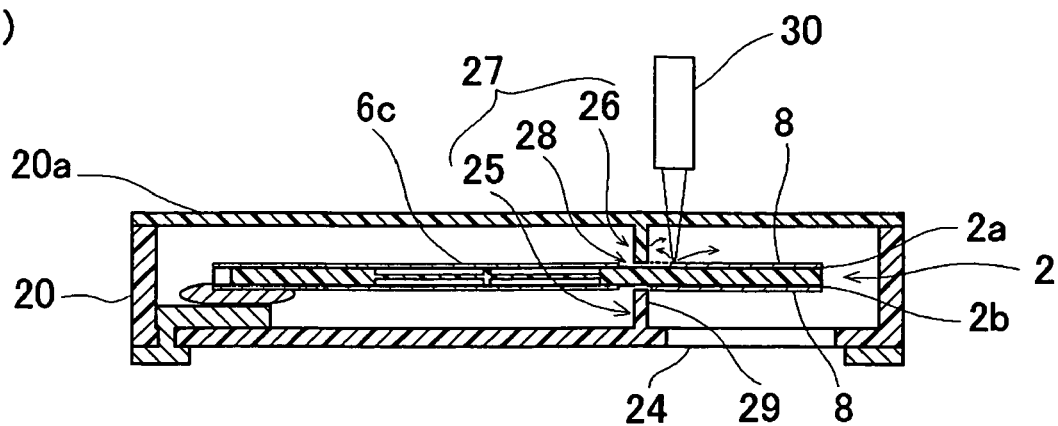
FIG. 5(a) to FIG. 5(c) are explanatory views illustrating frequency adjustment of the quartz-crystal resonator of this embodiment.
Figure 5:
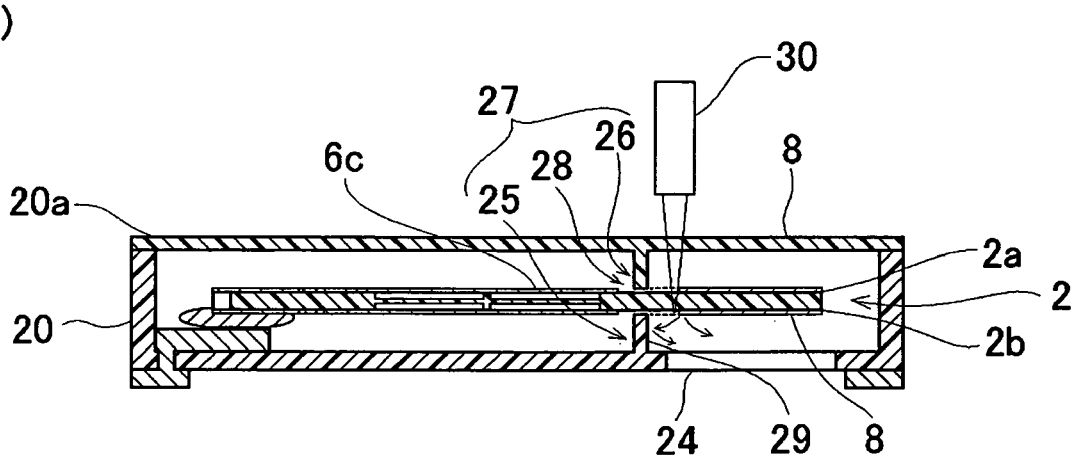
Figure 5:
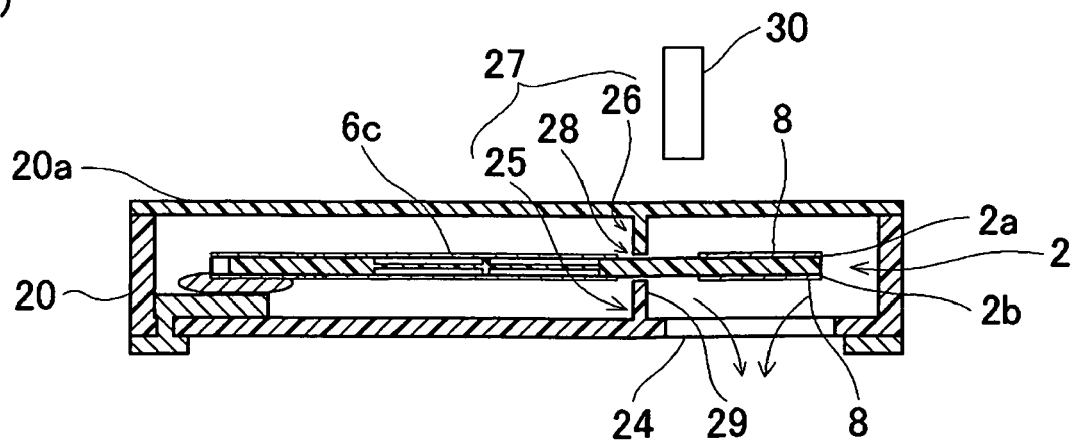

An embodiment in which the piezoelectric resonator of the present invention is applied to a quartz-crystal resonator will be described with reference to FIG. 1(a) to FIG. 5(c). As shown in FIG. 1(a) and FIG. 1(b), the quartz-crystal resonator is structured such that a quartz-crystal resonator element 10 is mounted in a casing 20. As shown in FIG. 2, the quartz-crystal resonator element 10 is formed such that groove portions 5a, 5b, excitation electrodes 6a, 6b, 6c, lead electrodes 7, and adjustment films 8 as weights for frequency adjustment are provided on a quartz-crystal piece 11 in a tuning fork shape which corresponds to a piezoelectric oscillating piece of the present invention and which includes a base portion 1 in a substantially rectangular shape and two oscillating arms 2 extending from the base portion 1 in parallel with each other. Note that in FIG. 2, formation areas of the excitation electrodes 6a, 6b, 6c, the lead electrodes 7, the adjustment films 8, and so on are hatched for easier understanding of the positions thereof.

The groove portions 5a, 5b are arranged in line in a longitudinal direction in each of the oscillating arms 2 and are each formed in a rectangular shape. The excitation electrodes 6a, 6b are provided on inner peripheral surfaces of the groove portions 5a, 5b, and the excitation electrodes 6c are provided in peripheral areas of the groove portions 5a, 5b so as to be a predetermined interval apart from the groove portions 5a, 5b. The excitation electrodes 6a, 6b, 6c are connected to the lead electrodes 7 formed on the base portion 1. Further, the adjustment films 8 are provided on tip sides of the oscillating arms 2 so as to be apart from the excitation electrodes 6c. The adjustment films 8 are made of, for example, metal films made of Cr (chromium) and Au (gold).

As shown in FIG. 1(a) and FIG. 3(a), the casing 20 is made of, for example, borosilicate glass capable of transmitting a laser beam and is formed in a rectangular parallelepiped shape with its upper surface side open, and an outer wall 20b is provided along a peripheral edge thereof. On an upper surface of the outer wall 20b, that is, its surface bonded to a cover 20a (to be described later), a metal film 3 made of, for example, aluminum or the like, is formed for use for anodic-bonding of the casing 20 and the cover 20a. Further, the casing 20 has a discharge port 24 and a lower wall portion 25. The discharge port 24 is an opening with a 150 μm diameter, for instance, which is formed in a projection area of the adjustment films 8 in a bottom portion of the casing 20 and through which shavings of the adjustment films 8 are discharged to the outside.

The lower wall portion 25 is formed to extend from the bottom portion of the casing 20 toward the casing upper surface, and when the quartz-crystal resonator element 10 is mounted, the lower wall portion 25 is orthogonal to the quartz-crystal resonator element 10, that is, vertical to the quartz-crystal resonator element 10 set horizontal so that an atmosphere between the quartz-crystal resonator element 10 and the bottom surface of the casing 20 is divided into an atmosphere where the excitation electrodes 6c are located and an atmosphere where the adjustment films 8 are located. The lower wall portion 25 is formed so that its edge portion does not come into contact with the oscillating arms 2 which are oscillating.

Further, the casing 20 has, in its longitudinal one side portion, totally two mounting electrodes 21, one for each of left and right portions of the casing 20. The mounting electrodes 21 are provided on upper surfaces of mounting portions 21a provided on the bottom portion of the casing 20 and each made of an insulator, and are electrically connected to external electrodes 23 which are provided on the bottom portion of the casing 20, via electrodes (not shown) provided inside the mounting portions 21a. Note that in FIG. 1(b) and FIGS. 3(a) to 3(c), cross sections taken along the arrow A-A in FIG. 1(a) are shown and the illustration of the quartz-crystal resonator element 10 is simplified for convenience of description.

On the upper surface side of the casing 20, the cover 20a for sealing the casing 20 is attached. Similarly to the casing 20, the cover 20a is made of, for example, borosilicate glass capable of transmitting a laser beam. Further, the cover 20a has an upper wall portion 26. As shown in FIG. 1(b) and FIG. 3(a), the upper wall portion 26 is formed to extend from the cover 20a toward the casing lower surface, and when the quartz-crystal resonator element 10 is mounted, the upper wall portion 26 is orthogonal to the quartz-crystal resonator element 10, that is, vertical to the quartz-crystal resonator element 10 set horizontal so that an atmosphere between the quartz-crystal resonator element 10 and the cover 20a is divided into an atmosphere where the excitation electrodes 6c are located and an atmosphere where the adjustment films 8 are located Further, the upper wall portion 26 is formed so that its edge portion does not come into contact with the oscillating arms 2 which are oscillating. When the quartz-crystal resonator is assembled, the lower wall portion 25 and the upper wall portion 26 form, inside the casing 20, one wall portion 27 having a passage area 28 formed in a shape allowing the passage of the oscillating arms 2 and not hindering the oscillation of the oscillating arms 2. In this embodiment, a wall surface 29, of the wall portion 27, facing the atmosphere where the adjustment films 8 are located corresponds to a wall surface of the present invention (see FIG. 4(c) to be described later).

Next, methods of manufacturing the quartz-crystal resonator element 10, the casing 20, and the cover 20a will be briefly described. First, the method of manufacturing the quartz-crystal resonator element 10 will be described. A metal film and a resist pattern are stacked on a quartz-crystal wafer W being a piezoelectric substrate and a large number of the quartz-crystal pieces 11 in a tuning fork shape including the grooves are formed by using wet etching. Thereafter, the excitation electrodes 6a, 6b, 6c, the lead electrodes 7, and the adjustment films 8 are formed on the quartz-crystal pieces 11 by patterning, and the wafer W is cut by dicing into the individual quartz-crystal resonator elements 10.

The casing 20 and the cover 20a are each formed by etching following the formation of an etching mask on a glass substrate. In the casing 20, first, the outer wall 20b is formed in a state where glass in a formation area of the lower wall portion 25 is left, and thereafter, by etching following the formation of an etching mask corresponding to the discharge port 24 and the lower wall portion 25, the discharge port 24 and the lower wall portion 25 are formed. Then, the aforesaid metal film 3 is formed on the upper portion of the outer wall 20b. Further, in the cover 20a, by etching following the formation of an etching mask corresponding to the upper wall portion 26, the upper wall portion 26 is formed. Incidentally, in this embodiment, the casing 20 and the cover 20a are made of borosilicate glass, but as an embodiment of the present invention, the material of the casing may be any substance capable of transmitting a laser beam, and may be, for example, soda glass or quartz crystal. Further, when the casing and the cover are made of quartz crystal, the quartz-crystal resonator may be formed in such a manner that the casing and the cover are formed by using quartz-crystal substrates and the quartz-crystal substrates and a quartz-crystal substrate on which the quartz-crystal resonator element is formed are stacked.

Next, a method of manufacturing the quartz-crystal resonator will be described with reference to FIGS. 3(a) to 3(c) and FIGS. 4(a) to 4(c). As shown in FIG. 3(b), FIG. 4(a), and FIG. 4(b), the lead electrodes 7 and the mounting electrodes 21 are electrically connected via conductive adhesives 22, so that the individually cut quartz-crystal resonator element 10 is mounted in the casing 20 to be parallel with the bottom surface of the casing 20, next the cover 20a seals the upper surface side of the casing 20 as shown in FIG. 3(c) and FIG. 4(c), and a DC current is applied for a predetermined time to the metal film 3 formed on the upper surface of the outer wall 20b, whereby the cover 20a and the casing 20 are anodic-bonded.

After the quartz-crystal resonator including the quartz-crystal resonator element 10 is formed by the above-described processes, the quartz-crystal resonator is next mounted on a jig for frequency adjustment (not shown) and inserted into a vacuum chamber (not shown), the quartz-crystal resonator element 10 is oscillated in a vacuum atmosphere, and while its frequency is measured, the adjustment films 8 are shaved by a laser cutter 30 until the frequency becomes a desired value. The adjustment films 8 are composed of, for example, blocks with a predetermined size arranged in an island form, and for the frequency adjustment, blocks in number corresponding to a difference between the measured frequency and a set frequency are removed. For this block removal work, according to the difference between the measured frequency and the set frequency, a control unit outputs a control signal to a moving mechanism relatively moving the laser cutter 30 and the jig on a plane, and according to the control signal, the blocks to be removed of the adjustment films 8 are sequentially irradiated with the laser beam.

In the process of shaving the adjustment films 8, it is possible not only to shave the adjustment films 8 only on front surfaces 2a or rear surfaces 2b of the oscillating arms 2 but also to shave the adjustment films 8 on both of the front surfaces 2a and the rear surfaces 2b of the oscillating arms 2 at one time, and either one is selected in the work. When the adjustment films 8 only on one side, for example, the adjustment films 8 only on the front surfaces 2a of the oscillating arms 2 are shaved, a module generating the laser beam of the laser cutter 30 is changed to a module generating a short-wavelength laser beam and a depth of focus of the laser beam is finely adjusted so that only the adjustment films 8 on the front surfaces 2a of the oscillating arms 2 can be shaved as shown in FIG. 5(a). Then, the laser beam is focused on positions, of the front surfaces 2a, where the adjustment films 8 are formed. Consequently, the laser beam can be irradiated so that it passes through the cover 20a to shave the adjustment films 8 on the front surfaces 2a. At this time, by adjusting the depth of focus of the laser beam so that heat of the laser beam is not transferred to the adjustment films 8 on the rear surfaces 2b, it is possible to prevent the laser beam from passing through the oscillating arms 2 and shaving the adjustment films 8 on the rear surfaces 2b, and consequently, only the adjustment films 8 on the front surfaces 2a can be shaved.

On the other hand, when the adjustment films 8 on both of the front surfaces 2a and the rear surfaces 2b of the oscillating arms 2 are shaved, by adjusting the depth of focus of the laser beam so that the heat of the laser beam is transferred to the adjustment films 8 on the rear surfaces 2b, the laser beam is made to pass through the oscillating arms 2 to shave the adjustment films 8 on the rear surface 2b, or by changing the module generating the laser beam to a module generating a long-wavelength laser beam, the laser beam of the laser cutter 30 is focused on the positions, of, for example, the front surfaces 2a or the rear surfaces 2b, where the adjustment films 8 are formed. Consequently, the laser beam is irradiated so that it passes through the cover 20a to shave the adjustment films 8 on the front surfaces 2a, and further passes through the oscillating arms 2 to shave the adjustment films 8 on the rear surfaces 2b, and consequently, the adjustment films 8 on the front surfaces 2a and the rear surfaces 2b can be shaved at one time. Incidentally, when only the adjustment films 8 on the rear surfaces 2b are shaved, the quartz-crystal resonator is turned upside down and the adjustment films 8 on the rear surfaces 2b are directly irradiated with the laser beam.

As shown in FIGS. 5(a), 5(b), during the process of shaving the adjustment films 8, part of the adjustment films 8 evaporate and part thereof scatter from the front surfaces 2a and the rear surfaces 2b in a solid form or while left in a liquid form. Owing to the presence of the wall surface 29, shavings scattering toward the atmosphere where the excitation electrodes 6a, 6b, 6c are located, out of the scattering shavings, collide with the wall surface 29 to drop toward the atmosphere where the adjustment films 8 are located and the shavings of the adjustment films 8 accumulate in the atmosphere where the adjustment films 8 are located, inside the casing 20.

The evaporating adjustment films 8 and the shavings are discharged out of the casing 20 through the discharge port 24. Since the process of shaving the adjustment films 8 is performed in a vacuum chamber, the atmosphere in the casing 20 is constantly sucked by a vacuum pump (not shown) in the vacuum chamber via the discharge port 24. The evaporating adjustment films 8 and the shavings are discharged to the outside through the discharge port 24 by a suction force of the vacuum pump. Consequently, it is possible to lower the probability that the quartz-crystal resonator becomes defective due to the adhesion of the shavings to the quartz-crystal resonator after the frequency adjustment. Through the above-described processes, the quartz-crystal resonator with a desired frequency is manufactured, and after the discharge port 24 is thereafter sealed, the quartz-crystal resonator is mounted on an electronic component such as a watch.

According to the embodiment described above, in the casing 20 of the quartz-crystal resonator, the wall surface 29 is interposed between the atmosphere where the excitation electrodes 6a, 6b, 6c are located and the atmosphere where the adjustment films 8 are located, and therefore, when the adjustment films 8 are shaved for the frequency adjustment, the wall surface 29 blocks off the scattering shavings to reduce the adhesion of the shavings to the excitation electrodes 6a, 6b, 6c. This prevents the occurrence of a failure of the quartz-crystal resonator due to a short-circuit or the like of the excitation electrodes 6a, 6b, 6c.

Further, in this embodiment, the wall portion 27 physically prevents the shavings of the adjustment films 8 from adhering to the excitation electrodes 6a, 6b, 6c. Therefore, even if the excitation electrodes 6a, 6b, 6c and the adjustment films 8 are formed up to the vicinity of the passage area 28 of the wall portion 27, it is possible to prevent the shavings of the adjustment films 8 from adhering to the excitation electrodes 6a, 6b, 6c. This allows an increase in an area where the adjustment films 8 can be formed, which makes it possible to thin the thickness of the adjustment films 8 to enable subtler frequency adjustment. Therefore, a rough adjusting area and a fine adjustment area can be set, the former being set in such a manner that, for example, the adjustment films 8 with a large thickness are formed in part of the formation area of the adjustment films 8, for example, on one of the front surfaces 2a and the rear surfaces 2b of the oscillating arms 2 or are formed in a local area close to the tips of the oscillating arms 2, and the latter being set in such a manner that, for example, the adjustment films 8 with a smaller thickness than that in the rough adjustment area are formed in the other area.

Incidentally, in this embodiment, the discharge port 24 is provided in the bottom portion of the casing 20, but as an embodiment of the present invention, if the residual shavings of the adjustment films in the casing is tolerated because of a reason that, for example, an amount of the shaved adjustment films is small or the like, the discharge port need not be provided. In this case, it is possible to make the atmosphere in the casing vacuum when the quartz-crystal resonator element is mounted in the casing and the casing is sealed by the cover, and in this state, the laser cutter is allowed to shave the adjustment films. This makes it possible to eliminate the process of sealing the discharge port.

Other Embodiments

Figure 6:
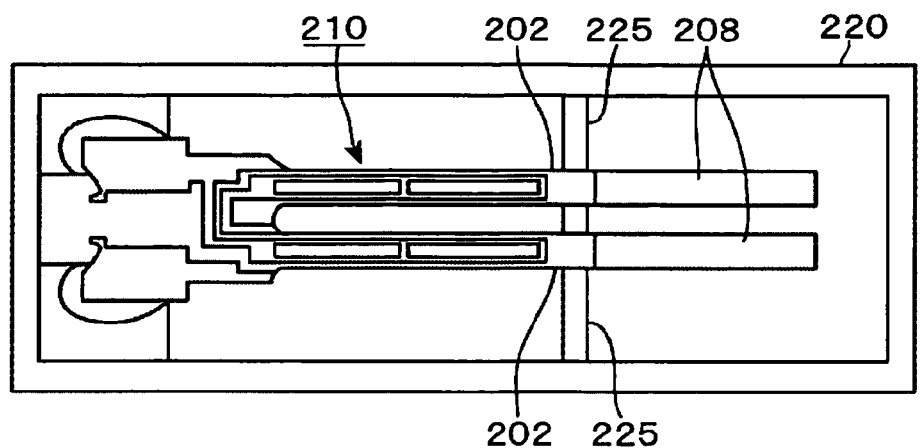
FIG. 6(a) to FIG. 6(c) are explanatory views illustrating the structure of a quartz-crystal resonator of another embodiment.
Figure 6:
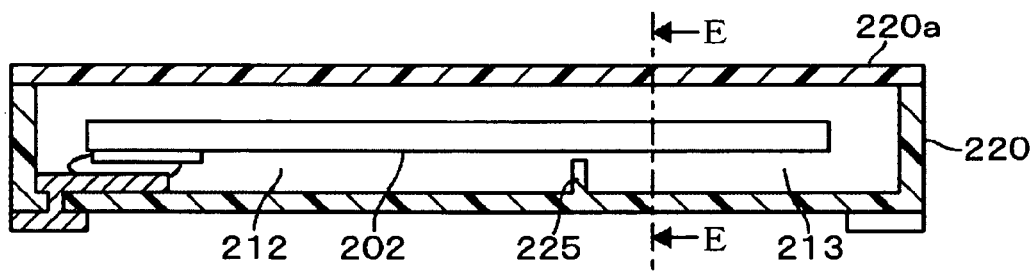
Figure 6:
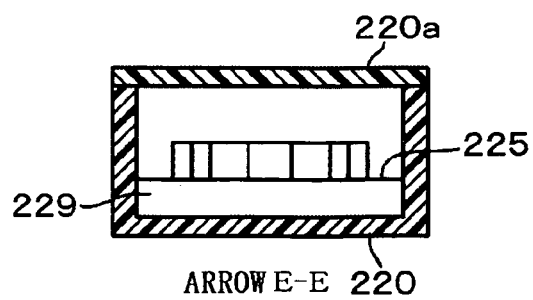

A quartz-crystal resonator shown in FIGS. 6(a) to 6(c) as another embodiment of the present invention has a casing 220, a cover 220a, and a quartz-crystal resonator element 210, and is structured such that the quartz-crystal resonator element 210 is mounted in the casing 220 and the cover 220a is attached to seal the casing 220. The quartz-crystal resonator has the same shape as that of the quartz-crystal resonator of the first embodiment except in that the discharge port 24 is not formed in the casing 220, the upper wall portion 26 is not formed in the cover 220a, and adjustment films 208 are different in shape from the adjustment films 8.

In this quartz-crystal resonator, the upper wall portion is not formed in the cover 220a, and therefore, when the quartz-crystal resonator is assembled, there is only a lower wall portion 225 formed between an atmosphere where excitation electrodes 206c are located and an atmosphere where the adjustment films 208 are located inside the casing 220 as shown in FIGS. 6(b) and 6(c). Therefore, in this quartz-crystal resonator, an upper area in the casing 220 which is closed by the upper wall portion 26 in the first embodiment is open as shown in FIG. 6(c), so that the atmosphere where the excitation electrodes 206c are located and the atmosphere where the adjustment films 208 are located are continuously formed.

Figure 7:
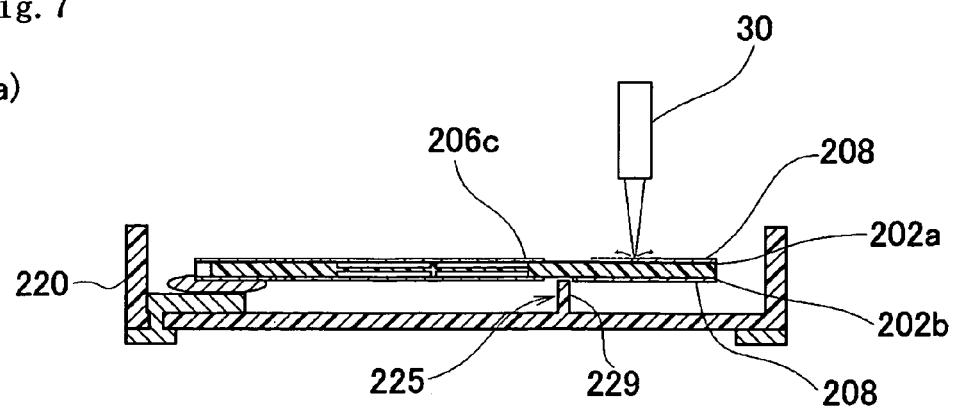
FIG. 7(a) to FIG. 7(d) are explanatory views illustrating frequency adjustment of the quartz-crystal resonator of the other embodiment.
Figure 7:
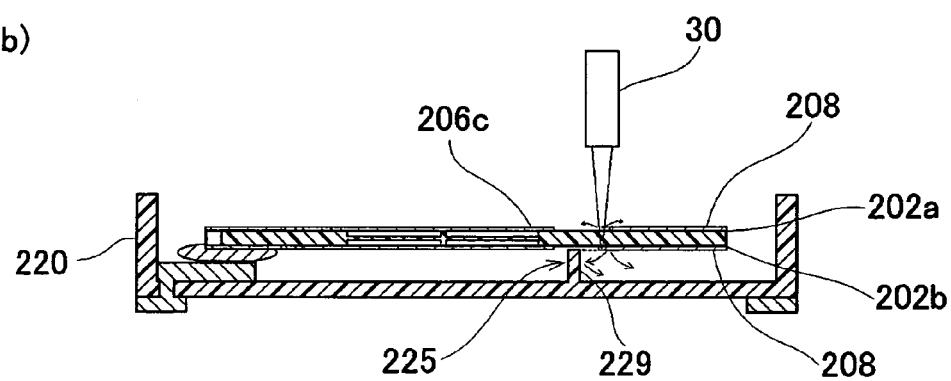
Figure 7:
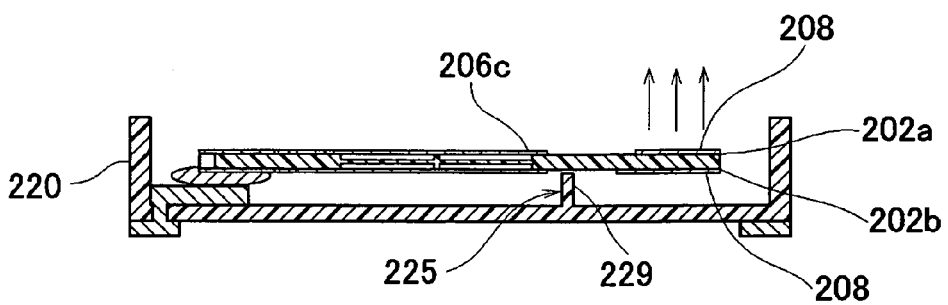
Figure 7:
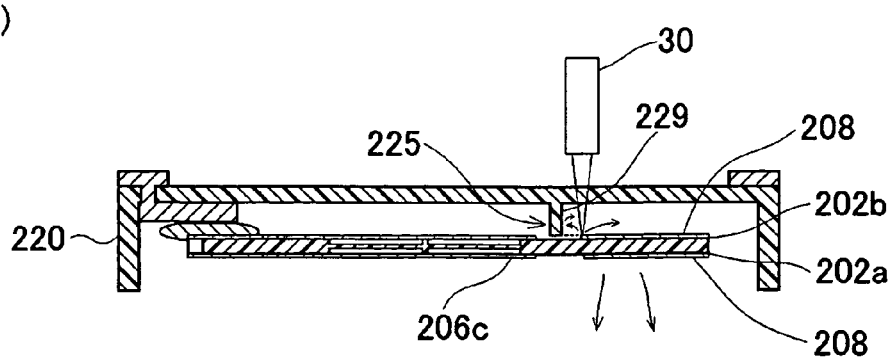

Therefore, in this quartz-crystal resonator, in order to prevent scattering shavings of the adjustment films 208 from entering the atmosphere where the excitation electrodes 206c are located and adhering to the excitation electrodes 206c, the excitation electrodes 206c and the adjustment films 208 are provided to be apart from each other by, for example, a 50 μm distance (see FIG. 7(a)) so that the shavings of the adjustment films 208 on front surfaces 202a, even if scattering, do not reach the excitation electrodes 206c. Note that the adjustment films 208 on rear surfaces 202b and side surfaces of oscillating arms 202 are formed in the same manner as those of the first embodiment.

At the time of the frequency adjustment of such a quartz-crystal resonator, when the evaporating adjustment films 8, the shavings, and so on need to be discharged to the outside, the frequency adjustment is made before the sealing by the cover 220a, that is, while an upper surface of the casing 220 is open since the discharge port 24 is not formed in the casing 220. When the adjustment films 208 on the front surfaces 202a are shaved, the shavings of the adjustment films 208 enter the atmosphere where the excitation electrodes 206c are located but the shavings drop to the oscillating arms 202 and a bottom portion of the casing 220 before reaching the excitation electrodes 206c. On the other hand, the shavings of the adjustment films 208 formed on the rear surfaces 202b collide with a wall surface 229 of the lower wall portion 225 as shown in FIG. 7(b) and drop toward the atmosphere where the adjustment films 208 are located in a similar manner to that in the first embodiment.

Then, the evaporating adjustment films 8 and the shavings are sucked by a vacuum pump from the upper surface of the casing 220 to be discharged to the outside as shown in FIG. 7(c) since a process of shaving the adjustment films 8 is performed in a vacuum chamber. Thereafter, the cover 220a is attached as shown in FIGS. 6(b), 6(c). Through the above processes, the quartz-crystal resonator is manufactured in this embodiment.

Another frequency adjusting method of this embodiment may be to turn the casing 220 upside down and shave the adjustment films 208 by a laser cutter 30 from the bottom portion of the casing 220 while the open upper surface is facing downward, as shown in, for example, in FIG. 7(d). When the casing 220 is thus turned upside down, the shavings of the adjustment films 208 drop by their own weight and are sucked to be discharged from the open upper surface to the outside of the casing 220, and therefore the shavings of the adjustment films 208 do not accumulate inside the casing 220, which can simplify the discharge process.

In the quartz-crystal resonator of the above-described embodiment, the scattering shavings collide with the wall surface 229 and do not scatter toward the atmosphere where the excitation electrodes 206a, 206b, 206c are located when the adjustment films 208 are cut for the frequency adjustment as in the first embodiment, and therefore, it is possible to adjust the frequency of the quartz-crystal resonator while preventing the shavings of the adjustment films 208 from adhering to the excitation electrodes 206a, 206b, 206c. Incidentally, in the embodiment shown in FIG. 7(a), since the irradiation of a laser beam of the laser cutter 30 is possible without the laser beam passing through the casing 220, the casing need not be made of a material capable of transmitting the laser beam in this embodiment.

Figure 8:
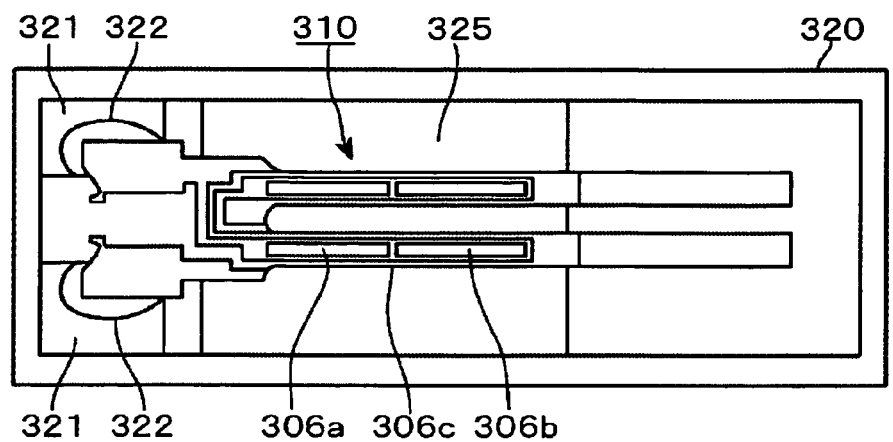
FIG. 8(a) and FIG. 8(b) are explanatory views illustrating the structure of a quartz-crystal resonator of still another embodiment.
Figure 8:
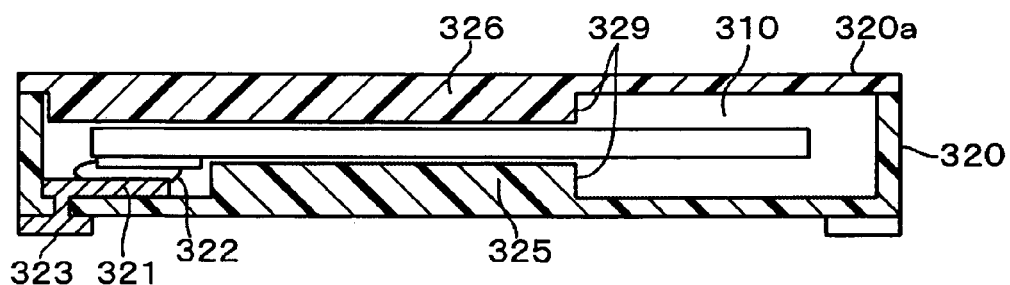
Figure 9:
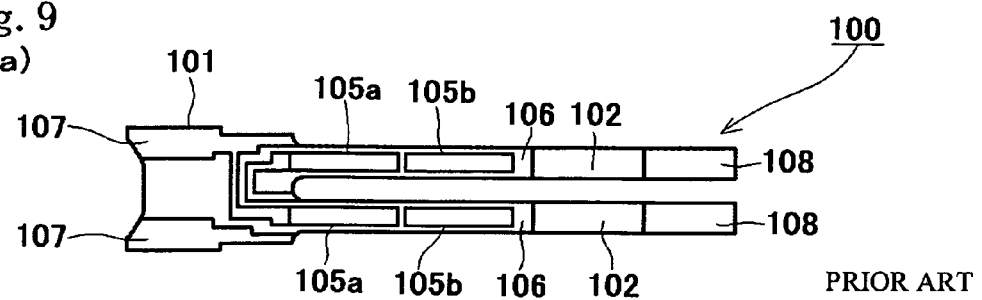
FIG. 9(a) to FIG. 9(c) are explanatory views illustrating a conventional tuning-fork quartz-crystal resonator.
Figure 9:
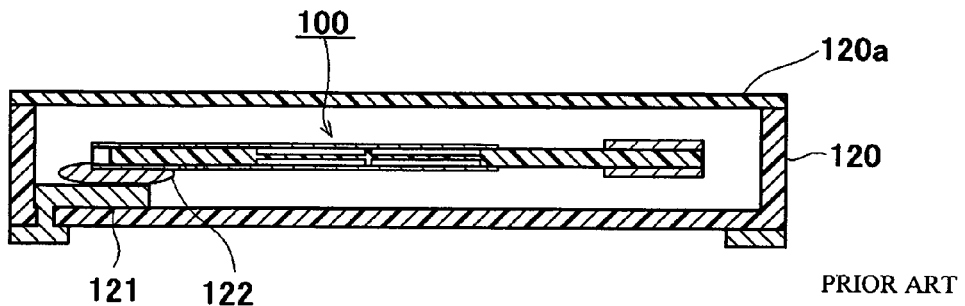
Figure 9:
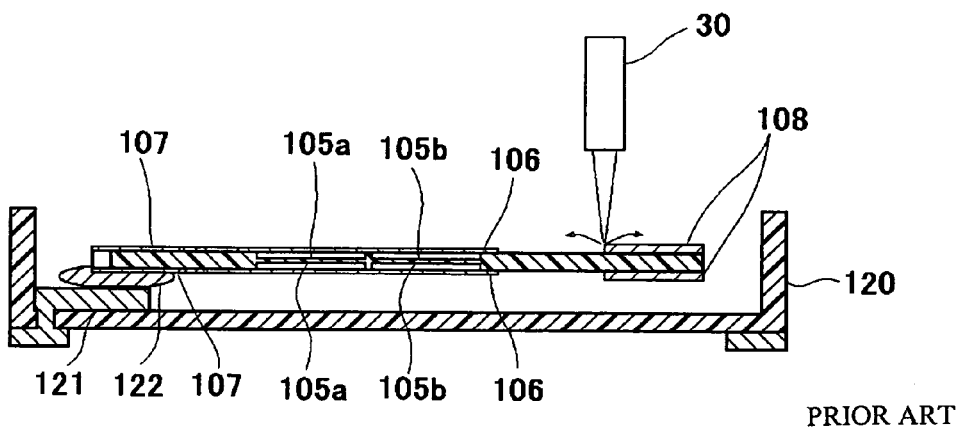

Further, a form shown in, for example, FIGS. 8a) and 8(b) may be an embodiment of the present invention. In this quartz-crystal resonator, a lower filling portion 325 is provided in a casing 320 and an upper filling portion 326 is provided in a cover 320a. When a quartz-crystal resonator element 310 is mounted in the casing 320, the lower filling portion 325 and the upper filling portion 326 fill a space of an atmosphere where excitation electrodes 306a, 306b, 306c are located so as not to hinder the oscillation of the quartz-crystal resonator element 310, so that a volume of an atmosphere where the excitation electrodes 306a, 306b, 306c are located is reduced as much as possible. Even when the lower filling portion 325 and the upper filling portion 326 are thus provided instead of the wall portion, side surfaces of the lower filling portions 325 and the upper filling portion 326 become a wall surface 329 corresponding to the wall surface of the present invention, so that the wall surface 329 can prevent the scattering shavings from adhering to the excitation electrodes 306a, 306b, 306c. Therefore, in such a quartz-crystal resonator, it is also possible to adjust the frequency of the quartz-crystal resonator in the same manner as in the first embodiment.

What is claimed is:

1. A method of manufacturing a piezoelectric resonator in which a casing houses a piezoelectric resonator element, the method comprising:
    manufacturing the piezoelectric resonator element including: a tuning-fork piezoelectric oscillating piece from whose base portion includes two oscillating arms extending in parallel with each other; excitation electrodes formed on the oscillating arms; adjustment films for frequency adjustment formed on tip sides of the oscillating arms so as to be apart from the excitation electrodes; and a lead electrode formed on the base portion;
    forming the casing including a wall surface which is provided between an atmosphere where the excitation electrodes are located and an atmosphere where the adjustment films are located and prevents shavings from scattering to the atmosphere where the excitation electrodes are located when the adjustment films are shaved;
    mounting the piezoelectric resonator element in the casing; and
    shaving the adjustment films by a laser beam to adjust a frequency of the piezoelectric resonator element in the casing.

2. The method of manufacturing the piezoelectric resonator according to claim 1, wherein the wall surface is a surface facing an adjustment film side of one of the adjustment films and projects from an inner wall surface of the casing.

3. The method of manufacturing the piezoelectric resonator according to claim 1, wherein a portion, of the casing, facing at least one surface side of an adjustment film formation area of the piezoelectric oscillating piece, is made of a light transmitting material and the casing has a discharge port for discharging the shavings on a side facing the atmosphere where the adjustment films are located.

4. The method of manufacturing the piezoelectric resonator according to claim 1, wherein in the casing, one surface side is opened.

5. The method of manufacturing the piezoelectric resonator according to claim 1, wherein in the casing, one surface side facing the piezoelectric resonator element is covered by a cover.

* * * * *